United States Patent [19]

Suzuki

[11] Patent Number: 4,655,601
[45] Date of Patent: Apr. 7, 1987

[54] OBSERVATION DEVICE AND AN ALIGNER USING SAME

[75] Inventor: Akiyoshi Suzuki, Tokyo, Japan

[73] Assignee: Canon Kabushiki Kaisha, Japan

[21] Appl. No.: 553,815

[22] Filed: Nov. 21, 1983

[30] Foreign Application Priority Data

Dec. 1, 1982 [JP] Japan ................ 57-210911

[51] Int. Cl.$^4$ .............................................. G01B 11/00
[52] U.S. Cl. .................................. 356/401; 355/53
[58] Field of Search .................. 356/400, 401, 398; 250/571, 557, 548; 355/53

[56] References Cited

U.S. PATENT DOCUMENTS 4,165,149 8/1979 Suzki et al. ....................... 356/400
4,278,893 7/1981 Kato et al. ......................... 356/401

Primary Examiner—R. A. Rosenberger
Assistant Examiner—Crystal D. Cooper
Attorney, Agent, or Firm—Fitzpatrick, Cella, Harper & Scinto

[57] ABSTRACT

An observation device usable with an apparatus for aligning two members each having alignment marks. The device includes an optical path for the beam reflected by the alignment marks, which at least partially is not common with an optical path for the beam directed to the alignment marks. In the uncommon optical path for the scanning beam or for the reflected beam, there is a 90 degree image rotator to provide, in the observation view field, a scanning direction which is traverse to a direction connecting the alignment marks, thus enabling an operator to observe images in natural forms.

7 Claims, 15 Drawing Figures

OBSERVATION DEVICE AND AN ALIGNER USING SAME

BACKGROUND OF THE INVENTION

The present invention relates to an observation device usable with alignment of objects or members and to an aligner for semiconductor circuits manufacturing, which uses the same.

As is well-known, IC (integrated circuits) and LSI (large scale integrated circuits) are manufactured by superposing a number of complicated circuit patterns. The tendency toward higher processing speed and higher density of patterns means that the width of the circuit lines is continuously required to be smaller and smaller, and the accuracy of alignment is required to be higher and higher even to the extent of the order of sub-microns. To meet such requirements, there is being developed an aligner of the step-and-repeat type, which is called a stepper. In a stepper, a pattern of a reticle is projected onto a wafer at a unit or reduced scale. Because of the limit to the design of the projection lens optical system, the projection area is necessarily limited or small so that the entire wafer surface cannot generally be exposed at one shot. Therefore, to cover the entire surface, the pattern is projected on a part of the wafer surface and stepped to the next part and projected, and this is repeated throughout a wafer. With the increase of the size of the wafer, the number of steps required for one wafer increases so that the time required for processing one wafer increases. On the other hand, prior to each projection of the pattern, i.e., exposure of the wafer to the pattern, the reticle and the wafer must have been aligned. So, how to align them is important from the standpoint of alignment accuracy and time taken to achieve alignment. It is known, as an OFF-AXIS alignment, to first correctly place one of them at a predetermined position outside the exposure station and then move it toward the exposure position by a predetermined distance which is assured by a laser interferometer. This type enables a high spaced operation, but involves problems that the alignment cannot be directly confirmed at the exposure station; that it cannot compensate for a non-linear local distortion which may be created in the wafer with experiences of wafer processing; and that the accuracy of the stage movement monitoring may affect the alignment.

There is a so-called TTL type apparatus wherein the wafer is observed through the projection lens at or adjacent the exposure position to align it with the reticle. This type can compensate for the local distortion of the wafer and can avoid the inaccuracy in the wafer stage movement so that a better alignment between the reticle and wafer can be expected.

For the TTL system, a laser beam scanning is known fior the alignment operation. An example thereof is described in a Japanese Laid-open Patent Application No. 54-53562 which has been filed by the Assignee of the present application. FIG. 1 shows a schematical view of the device disclosed therein, for the sake of explanation. A single laser beam from a single laser beam source 1 is split or divided into two beams, which are then directed to the lefthand and righthand objective optical systems 11, thus allowing to detect the displacement or degree of misalignment between the reticle 12 and wafer 13 at two positions. The two position detection allows two kinds of displacement, that is, X and Y direction (translational) displacement and $\theta$ (rotational) displacement to be corrected, by moving one of the reticle or the wafer relative to the other.

The optical system disclosed in FIG. 1 includes a condenser lens 2 for focusing the laser beam, a polygonal mirror 3, an f-$\theta$ lens 4 and a beam splitter 5. The laser beam emitted from the laser beam generator 1 is scanningly deflected by the polygonal mirror 3 and is incident on the beam splitter 5 and et seq. The system further includes a field lens 6, a view field splitting prism 25 which is effective also to divide the scanning laser beam into two beams. Because of the dual functions, the prism 25 may be said to be a view field dividing and spatial dividing prism. Each beam is passed through or reflected by a polarization beam splitter 7, a relay lens 8 and a beam splitter 9 and reaches an objective lens 11, by which it is imaged on the objects to scan the same. The system of optical elements extending from a pupil imaging lens 14 to a detector 18 constitutes a photoelectric detection system. The device further includes a chromatic filter 15; a spatial frequency filter 16 for blocking specularly reflected (by the reticle or wafer) beams but allowing scatteredly reflected beam to transmit; an illumination optical system having a condenser lens 17, a light source 19, a condenser lens 20 and a chromatic filter 21; an observation optical system having an erector 22 and an eye piece 23. The function and operation of those elements are explained in detail in the above-identified Patent Application, so that detailed explanations thereof are omitted for the sake of simplicity. In this example, the deflected beam, deflected by the polygonal mirror 3, is divided in its deflection range, by the view field dividing prism 25 which is optically conjugate with the reticle 12 and wafer 13, thus using effectively the quantity of light of the laser beam. The deflection line is transverse to the leading edge 25a of the prism 25. The respective beams divided out by the prism 25 are directed through the respective objective lens 11 to the alignment marks represented by a letter "F", and scan the same, respectively. The alignment scope having the microscopes has an additional important function, i.e., the observation of the alignment marks. The observation is one of the necessary functions, particularly, in monitoring the state of alignment and initial setting of a reticle. For the observation optical system, it is desired that the images are observed in a natural and easy manner.

FIG. 2 shows the image view fields observed through the eye piece 23 in the arrangement of FIG. 1. In FIG. 2, reference numeral 31 depicts the view field dividing line provided by the edge 25a of the view field splitting prism 25; 32, the scanning line of the laser beam; 33, the view field through the righthand side objective lens; and 34, the view field through the lefthand side objective. The alignment mark are represented as the letter "F" for the sake of simplicity of explanation. As shown in FIG. 2, the lefthand side alignment mark on the reticle 12 and the righthand side mark thereon are observed at the right and left view fields, respectively, through the microscope as erected images. The alignment marks play important roles in manufacturing semiconductor circuits, but do not provide any actual circuit patterns. So, after the wafer has been completely processed, the part thereof having the alignment marks are the non-usable areas. For this reason, the area occupied by an alignment mark is desirably as small as possible, so as to provide a better yield.

FIG. 3 shows an example of a reticle or mask (hereinafter called simply a reticle). If the alignment marks are provided on the scribe lines between adjacent chips 101, they do not require any particular space, so that the above-described problem is solved. Since the scanning laser beam runs in the direction connecting the alignment marks (this direction is called longitudinal direction in this specification), two alignment marks are arranged along this direction, that is, along and within a scribe line which is near the center of the reticle. The scribe line near the center, used for this purpose, is desirable since highly accurate alignment can be obtained.

However, in the case of a so-called stepper type exposure and alignment device, inter alia, in the reduction stepper, it is possible that one reticle, at its entity, corresponds to one chip so that there are scribe lines only at the marginal area, that is, no scribe lines are near the center which would be better to accommodate the alignment marks as explained above.

FIG. 4 shows a reticle having a pattern of only one chip, wherein the possible alignment marks are shown by reference numerals 102 and 103. Assuming that the scanning beams run from lefthand to righthand sides, for example, it is contemplated that a couple of alignment marks are arranged as indicated by reference numeral 102 or otherwise by reference numeral 103. In the latter case, that is, the case of marks 103, each of the alignment mark areas extends across the circuit pattern area, so that they require wider scribe lines. This is a serious problem since the yield is considerably decreased. In the former case, that is, the case of the alignment marks 102, such control is not so severely required, but the marks 102 are only at the upper side (in the FIG. 4), so that the misalignment is larger at the bottom side.

Those problems can be solved by the alignment marks 104 shown in FIG. 5, i.e., by placing the alignment marks near the center of the reticle and extending the alignment marks in the perpendicular direction i.e., the direction perpendicular to the longitudinal direction which is the direction connecting the two alignment marks, and correspondingly scanning the laser beam in the perpendicular direction.

The perpendicular scanning of the laser beam can be obtained in FIG. 1 arrangement by rotating the systems 1, 2 and 3 including the laser beam system parts and moving a wider laser beam along the edge 25a of the prism 25. This is the separation of the single laser beam along the direction of beam deflection, as contrasted to the FIG. 1 arrangement, as it is, wherein the beam is separated by the edge extending perpendicularly to the direction of beam deflection. Therefore, such modification of FIG. 1 arrangement is not advantageous in that the quantity of light is decreased to one half since the beam is divided along the deflection direction, and also in that noise light is always produced by the edge 25a of the prism 25. It is possible to simply insert a 90° image rotator at a suitable position after the prism 25 to convert a longitudinal direction scan to a perpendicular direction scan. If this is done, however, the reflected beam is also rotated by 90° so that the alignment mark (F) is rotated by 90°, thus disabling the natural and easy observation.

SUMMARY OF THE INVENTION

Accordingly, the principal object of the present invention is to eliminate the above described drawbacks.

Another object of the present invention is to provide an observation device wherein the alignment marks are scanned, in the direction perpendicular to the direction along which the alignment marks are arranged, and wherein the alignment marks can be observed in a natural and easy manner.

These and other objects, features and advantages of the present invention will become more apparent upon a consideration of the following description of the preferred embodiment of the present invention taken in conjunction with the accompanying drawings.

According to the preferred embodiment of the present invention, the single scanning beam is spatially divided in its deflection range, and the divided beams are rotated by 90° by image rotators to make the beams scan the alignment marks in the perpendicular direction, but the reflected beam, does not pass back through this 90° image rotator, and vice versa.

DESCRIPTION OF THE PREFERRED EMBODIMENT

Figure 6B:
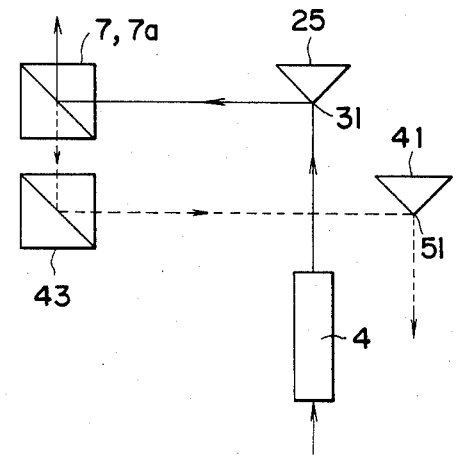
FIG. 6B shows a plan view of a part of the optical system illustrated in FIG. 6A.
Figure 5:
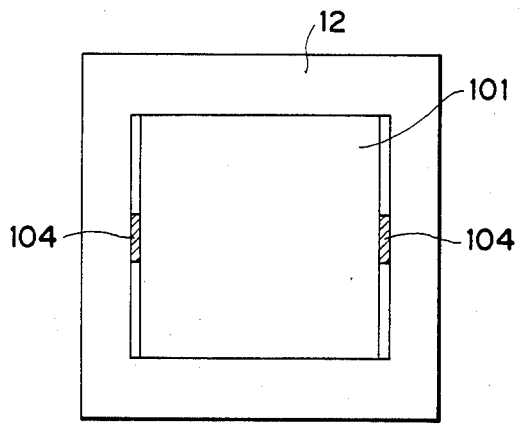
FIG. 5 shows alignment marks for a one-chip reticle, used with the present invention.
Figure 6A:
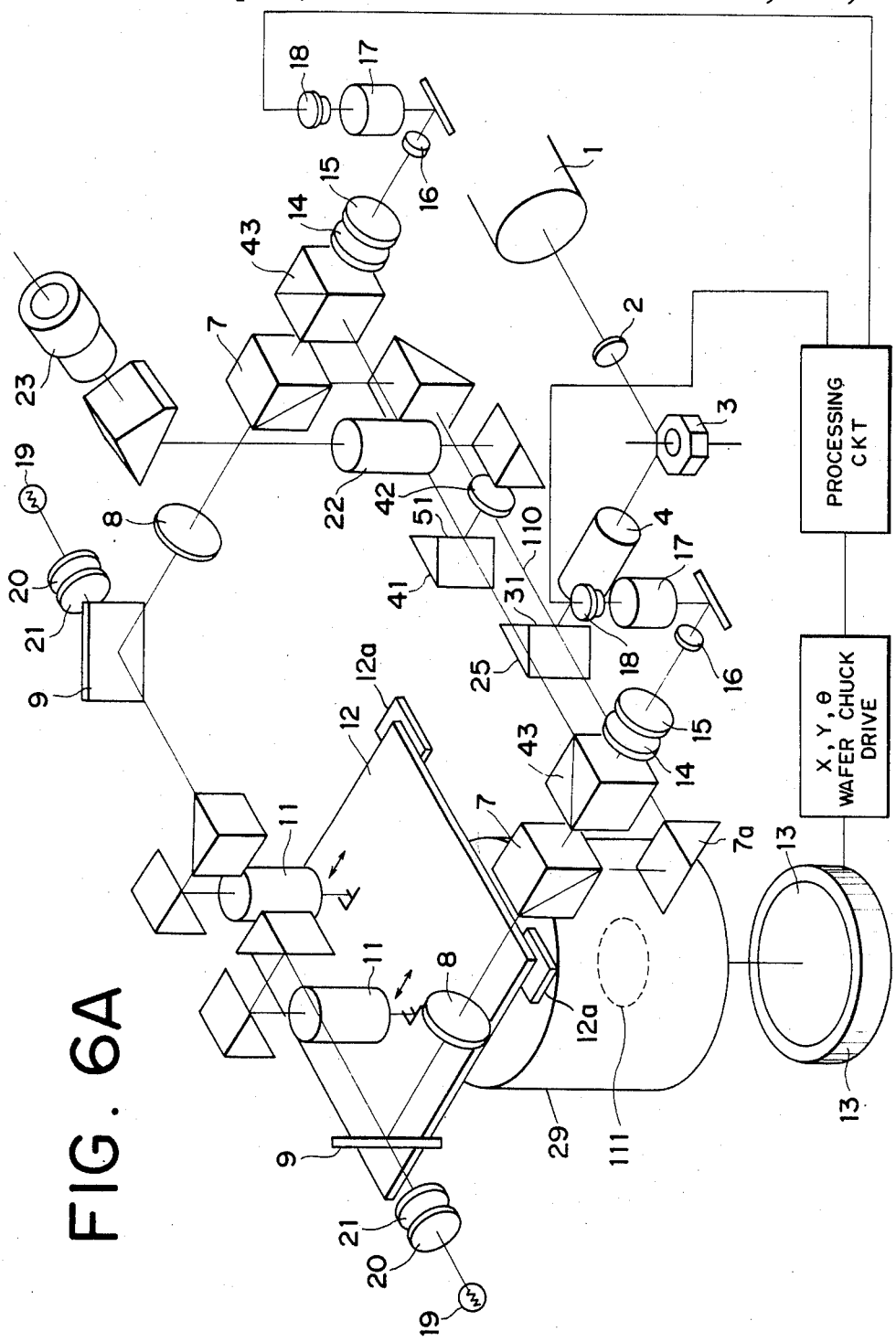
FIG. 6A shows a perspective view of an optical system of an embodiment according to the present invention.

FIG. 6A shows an arrangement of an observation device according to an embodiment of the present invention.

Figure 1:
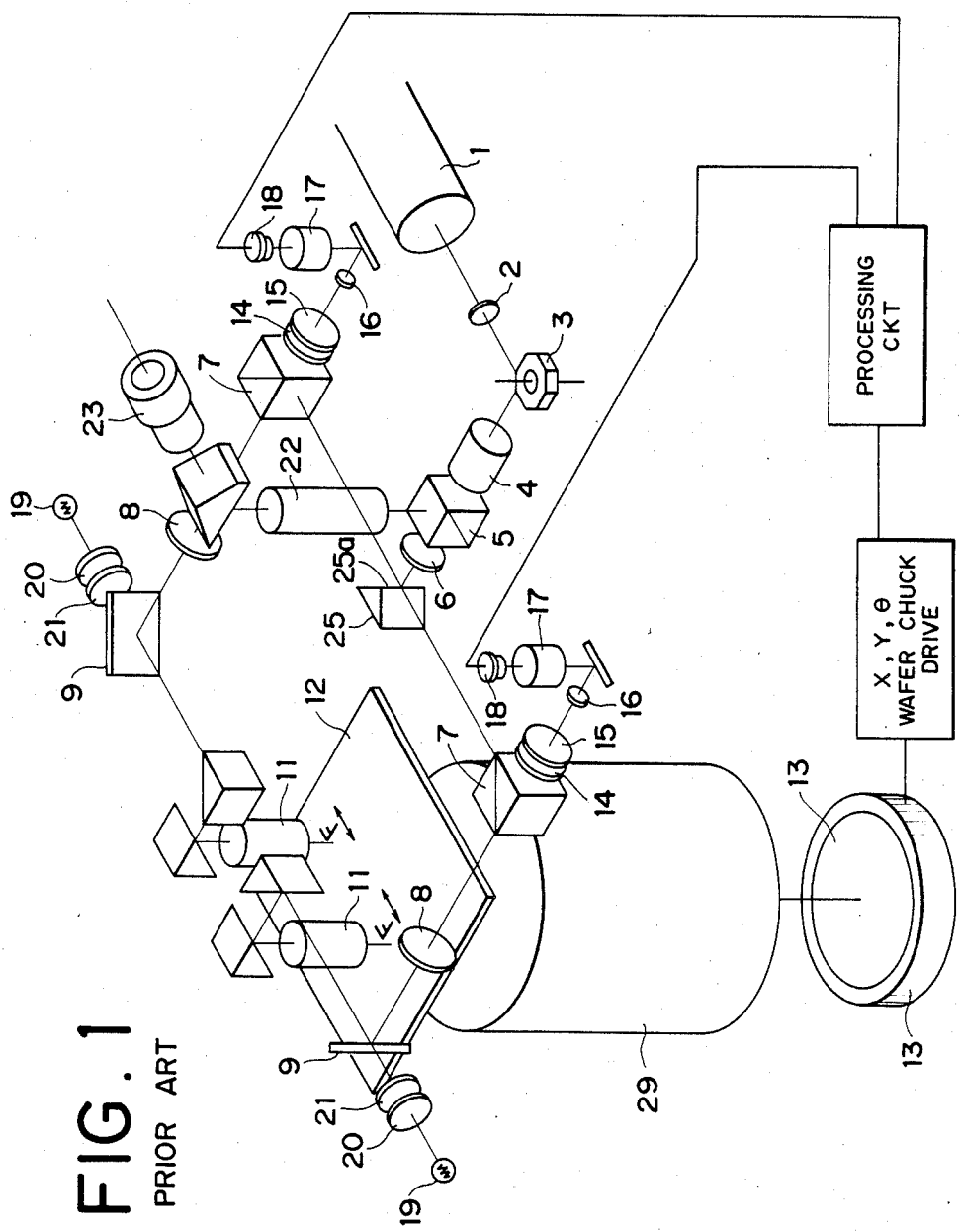
FIG. 1 shows a prior art optical system for observation and photoelectric detection.
Figure 2:
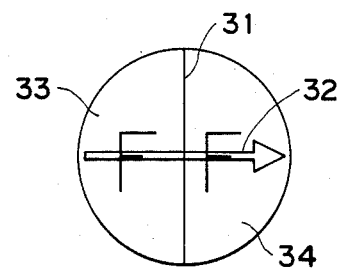
FIG. 2 shows a relation between a scanning line and a view field dividing prism.
Figure 3:
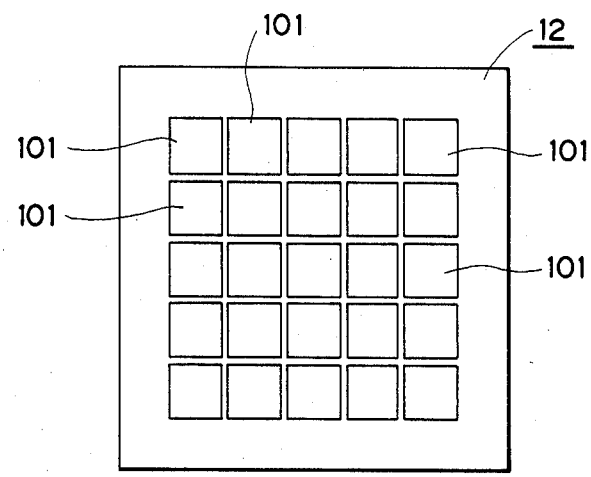
FIG. 3 shows an example of a mask or reticle.
Figure 4:
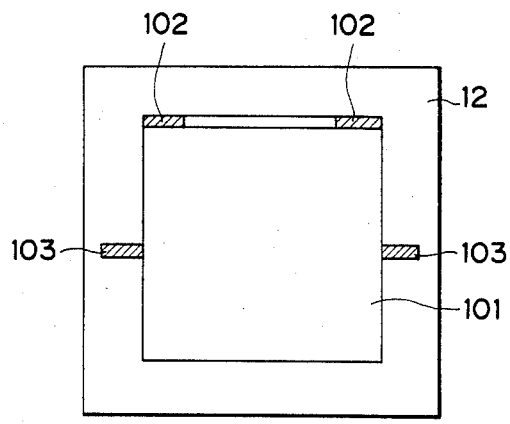
FIG. 4 shows alignment marks for a one-chip reticle.

The beam from a laser source 1 is deflected by a polygonal mirror 3. To receive the deflected beam, there is a Dach prism 25 having an edge 31 extending perpendicularly to the direction of deflection, as also shown in FIG. 6B. The surfaces of the prism roof are coated with light reflecting film, on or adjacent to which the laser beam is imaged by the lenses 2 and 4. The split beams 110 are rotated by substantially 90° by respective image rotators each consisting of the elements 7 and 7a so that the direction of deflection rotates by 90°. Now, for the sake of simplicity of explanation, only a lefthand side part of the system will be described, since the other part is symmetrical with it. The image rotator comprises the element 7a in the form of a prism having an inclined reflecting surface and the element 7 in the form of a glass block having a polarization beam splitter function with an inclined surface which is at 90° with respect to the inclined reflecting surface of the prism 7a. The 90° degree image rotator may be of another type having the similar function if desired. The scanning beam emergent from the image rotator is incident on the reticle 12 held by a reticle holder schematically shown at 12a, through a lens 8, beam splitter 9 and a microscope objective lens 11, to scan the alignment mark shown as a letter "F" in the perpendicular direction, shown by an arrow, i.e., perpendicular to the direction along which the two alignment marks are arranged. The reticle 12 and the prism 25 are optically conjugate. Similarly to the FIG. 1 arrangement, a projection lens 29 and a wafer 13 are disposed under the reticle 12. The beam scanning the reticle alignment marks also scans wafer alignment marks, corresponding thereto, in the perpendicular direction. The observation device further includes an illumination optical system for illuminating the alignment marks of the reticle 12 and the wafer 13 through the objective lens 11. The laser beam and the illumination beam reflected by the alignment marks of the reticle 12 and the wafer 13 go back to the objective lens 11. The reflected beam is incident on the glass block 7 via elements 9 and 8 in this order. It is added that the beam reflected back here has already passed twice through λ/4 plate 111 provided within the projection lens 29 so that the polarization direction of the reflected beam incident on the glass block 7 has been rotated by 90° as compared with the oncoming laser beam. Because of this rotation, the reflected beam is passed through the block or beam splitter 7, where the reflected beam is directed aside the oncoming beam path. The location of the λ/4 plate 111 is not limited to within the projection lens system 29, but may be placed at any suitable position optically between the polarization beam splitter 7 and the wafer 13.

Figure 7:
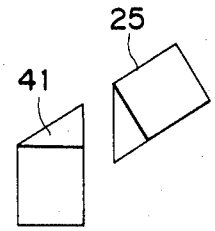
FIG. 7 shows an optical relationship between the two prisms.

Since the reflected beam is passed through the beam splitter 7, the reflected beam does now not trace back the scanning or oncoming beam, as described above. Therefore, this beam is not acted on by the 90° image rotator. The beam passed through the polarization beam splitter 7 and reflected by a beam splitter 43 is then directed to a Dach prism 41 having an edge 51, as shown in FIGS. 6A and 6B. The prism 41 is effective to combine the beams from the two objective lenses 11. The surfaces of the prism 41 are optically conjugate with the reticle 12. The images of the scanning lines formed on the surfaces are parallel to the edge of the prism 41, because the beams forming those images are not passed through the image rotator. Therefore, the image rotator having the elements 7 and 7a functions as if it would twist one of the Dach prisms 25 and 41 with the edges of the prisms perpendicular to each other as shown in FIG. 7. The inverted images are erected by the eye piece system elements 42, 22 and 23. The beam passed through a beam splitter or half mirror 43 is directed to a photodetector 18 through a spatial filter 15 for transmitting only a scattered beam. The alignment marks of the reticle 12 and the wafer 13 are sensed by the photodetector 18. Based on the signals produced by the photodetector 18 in response to the alignment marks, the processing circuit responsive thereto determines the degree of misalignment between the alignment marks of the reticle 12 and the wafer 13. To compensate for the misalignment, the wafer chuck 13' is moved in X, Y and θ directions by a motor or the like to bring the reticle 12 and the wafer 13 into alignment, as in the case of the FIG. 1 system.

Figure 8:
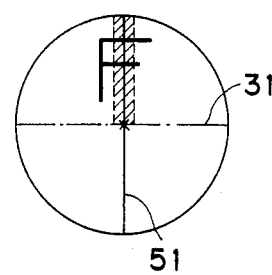
FIG. 8 shows images observed by the optical system of FIG. 6A which uses a co-axial optical arrangement.
Figure 9:
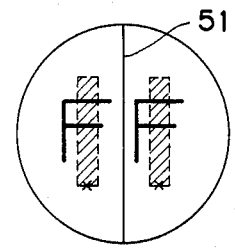
FIG. 9 shows images observed by the optical system of FIG. 6A which uses a eccentric optical arrangement.

FIG. 8 shows the image observed through the eye piece in the system of FIG. 6A. The pattern to be observed is represented as a letter "F". Since the edges of the view field dividing prism 41 and the spatial beam dividing prism 25 are optically perpendicular as shown in FIG. 7, the patterns separatedly located are imaged in order.

Figure 10:
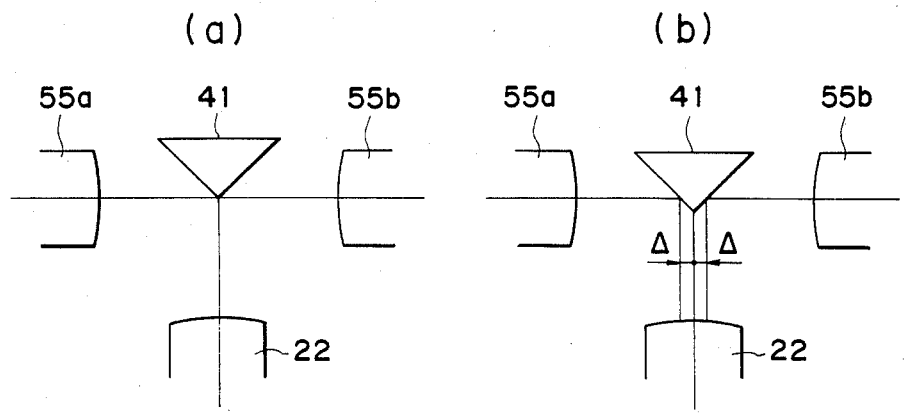
FIGS. 10A and 10B illustrate the co-axial optical arrangement and eccentric optical arrangement.

However, since the edge of the Dach prisms 25 and 41 are on the optical axis as shown in FIG. 6B, the right and left view fields are separated by the edge 51 of the Dach prism 41 so that the right and left view fields are not observed in their entity in the lateral direction, as will be understood from FIG. 10. Also, the beam for a bottom half view field is eclipsed by the Dach prism 25. This is solved by displacing the edge 51 of the Dach prism 41 out of the optical axis, i.e., by using an eccentric optical system.

FIG. 10 shows the function of such an eccentrical optical system. In this Figure, the left part depicted by (a), shows an ordinary co-axial optical system by which the image is seen as shown in FIG. 8. In this system the view field of the lefthand optical system 55a and the view field of the optical system 55b are combined by the view field dividing or splitting prism 41. In order to broaden the view field, as seen in FIGS. 6A and 6B, the optical axes for the optical system 55a and the optical system 55b are displaced by Δ, respectively as shown in FIG. 10(b). The direction of the displacement is perpendicular to the edge 51 of the view field dividing prism 41.

Figure 11:
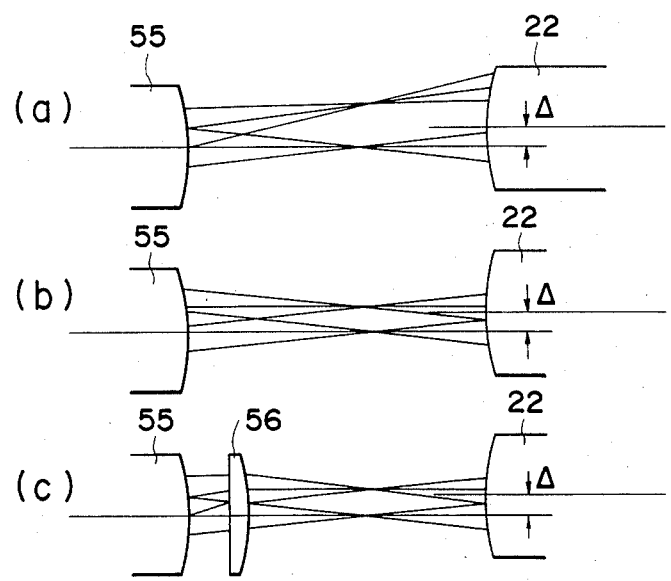
FIGS. 11A, 11B, and 11C illustrate a function of a telecentric optical system.

The eccentric optical system as shown in FIG. 10 may result in deterioration of the image to be observed, because of the eccentricity between the optical system 55a or 55b and the erector 22. To avoid this, it is desirable that the light rays at the position where the view fields are combined, are telecentric. This will be explained in conjunction with FIG. 11. FIG. 11(a) shows the non-telecentric case. Despite the fact that the proper performance of the optical system requires that the principal ray of the light rays above the optical axis of the erector 22 should be parallel to the optical axis, it is inclined. FIG. 11(b) shows the telecentric case, in which the principal rays of any light rays are parallel to the optical axis of the optical system 22. So, such a telecentric system can avoid the possibility of the above described problem. If the light rays emergent from the optical system 55 are as shown in part (a) of FIG. 11, a field lens 56 may be inserted after the optical system 55 to provide the same effect, as shown in part (c) of FIG. 11.

Figure 12A:
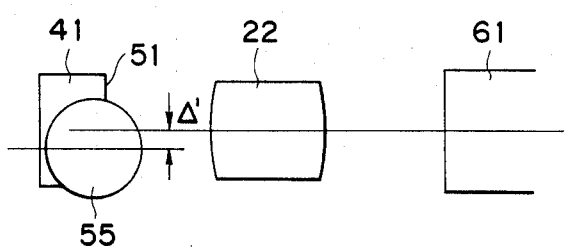
FIGS. 12A and 12B illustrate an eccentric optical arrangement wherein the direction of eccentricity is perpendicular to that of FIG. 10.
Figure 12B:
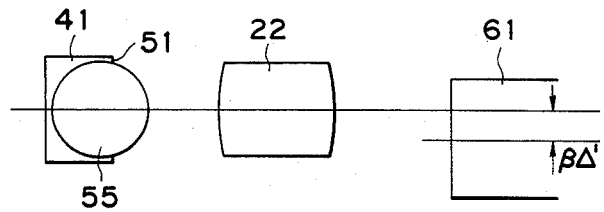

The displacement Δ for the combination of the view field can be provided in the manner as shown in FIG. 10. In order to avoid the eclipse by the spatial dividing prism 25, and therefore, to provide the visible bottom half of view field, the optical system 55 and the erector are relatively displaced by a certain amount Δ' as shown in FIG. 12a in the direction of the dividing line of the view field dividing prism 41, for example, by displacing the entire eye piece system along the edge 51. The same results are obtained by displacing by βΔ' the image pick-up element 61 with the optical system 55 and the erector 22 kept co-axial in the direction perpendicular to the edge 51, as shown in FIG. 12(b).

Figure 13:
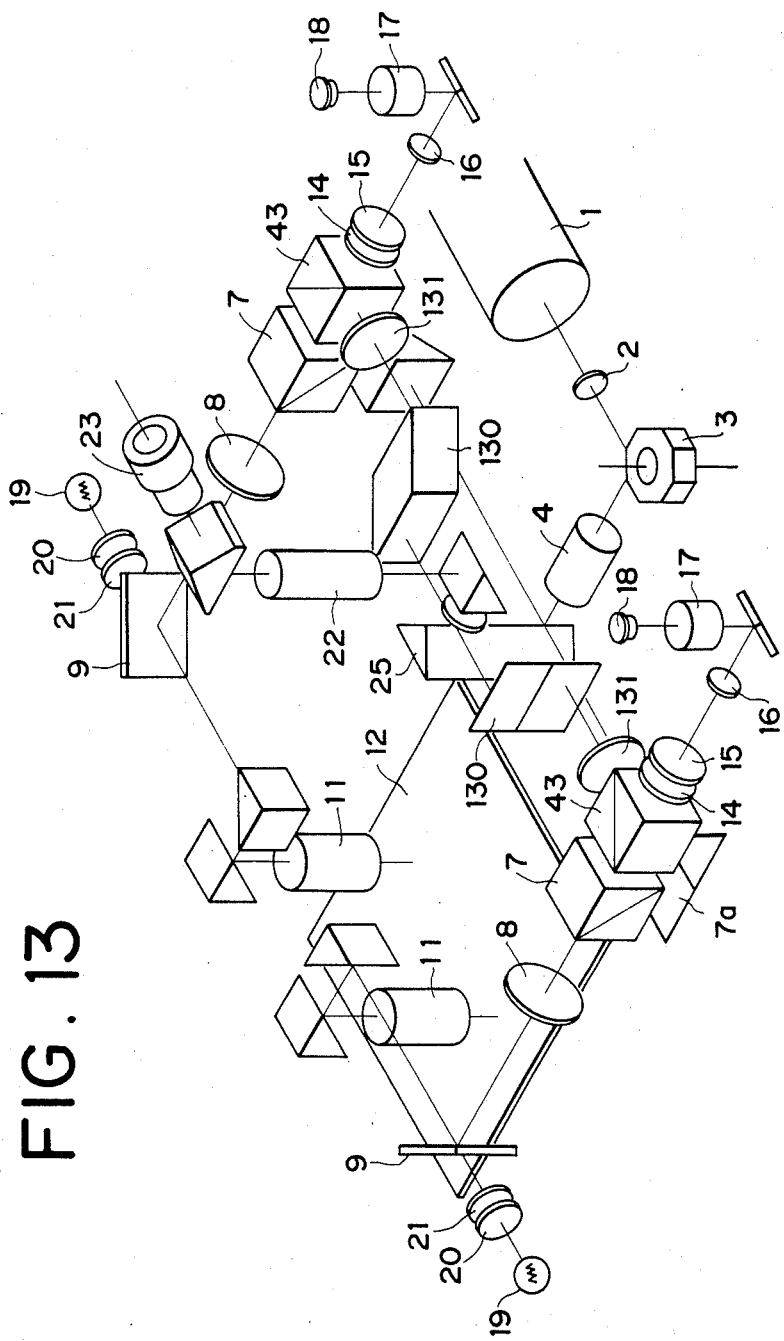
FIG. 13 shows an optical system of another embodiment according to the present invention.

The FIGS. 6A and 6B arrangement has two Dach prisms 25 and 41, but this is not always necessary. A single prism is enough. This arrangement is shown in FIG. 13. What is different from FIG. 6A arrangement is the prisms 130 which are inserted between the beam splitters 43 and the Dach prism 25, respectively. The change, in the optical path length, caused by the insertion of the prisms 130 is corrected by the lenses 131. The prisms 130 are effective to suitably displace the optical path. The amount of displacement is determined relying on how much eccentricity is to be provided.

The FIG. 6A arrangement has been shown as having a 90° image rotator in the optical path for the scanning beam, not in the optical path for the reflected beam. However, it can be disposed only in the optical path for the reflected beam to provide the same effects. For this purpose, the FIG. 6A arrangement may be modified by exchanging the laser beam system comprising the laser source 1, the condenser lens, the polygonal mirror 3 and the f-θ lens with the observation system comprising the eye piece 23, lenses 22 and 42 and prisms to introduce the laser beam to the prism 41 and direct the reflected beam to the prism 25; and by omitting one of the two prisms above the objective lens 11 and rotating the rest by 90° so that the oncoming beam reflected by the element 9 goes downwardly toward the objective lens after being reflected by the remaining prism. In this case elements 9, 21, 20 and 19 are displaced away from the element 8 by the distance between the two prisms above the objective lens 11 to keep the position of the objective lens.

Those modifications can be applied to the FIG. 13 arrangement, too.

According to another aspect of the present invention, the observation is possible only with the laser beam source. If, for example, He-Cd laser (441.6 nm) is used, the chromatic aberration of the lens which is corrected for g radiation (435.8 nm) is not a problem with the scanning laser beam. If the projection system is constituted by a mirror optical system which has little or no chromatic aberration, a He-Ne laser or Ar+ laser or others can be used. In those cases, a common beam source is usable for both of the observation optical system and the photoelectric detection optical system, so that the structure of the device can be simplified. It is apparent for one skilled in the art that the optical intersection angle between the edges of the view field dividing prism 41 and the deflection dividing prism 25 are not limited to 90°, but other angles are possible.

While the invention has been described with reference to the structures disclosed herein, it is not confined to the details set forth and this application is intended to cover such modifications or changes as may come within the purposes of the improvements or the scope of the following claims.

What is claimed is:

1. An observation device usable with an apparatus for aligning two members having respective alignment marks, wherein a deflecting beam is used to scan the alignment marks, said device comprising:
   a spatial beam splitter for spatially splitting the deflecting beam to provide split scanning beams;
   a first optical system, having an optical path, for directing each of the split scanning beams to the alignment marks to be reflected therefrom, said first optical system including an objective lens;
   a second optical system, having an optical path at least a part of which is not common with said optical path of said first optical system, for receiving the beams reflected by the alignment marks; and
   an image rotator, disposed in only one of said first and second optical systems; said spatial beam splitter also functioning as a view field splitter for combining view fields.

2. A device according to claim 1, wherein said image rotator is effective to rotate an image substantially by 90 degrees.

3. A device according to claim 1 or 2, wherein said beam deflects in the direction transverse to the edges of said spatial beam splitter.

4. A device according to claim 1, wherein said beam splitter has a first portion for spatially splitting the deflecting beam and having a prism edge, and a second portion functioning as said view field beam splitter and having a prism edge, said first and second portions having their respective prism edges extending optically with a predetermined angle therebetween.

5. A device according to claim 4, wherein the predetermined angle is 90°.

6. A device according to claim 1 or 2, further comprising optical elements optically preceding and optically succeeding said spatial beam splitter functioning as a view field beam splitter and wherein an optical axis of said optical element preceding said spatial beam splitter functioning as said view field beam splitter and an optical axis of said optical element succeeding said spatial beam splitter functioning as said view field beam splitter are not coaxial.

7. A device according to claim 6, wherein said optical elements are optically connected by a telecentric optical system.

* * * * *